US012717065B1

(12) United States Patent
Wollack et al.

(10) Patent No.: US 12,717,065 B1
(45) Date of Patent: Aug. 25, 2026

(54) ATOMIC LAYER DEPOSITION (ALD) ENHANCED FAR-TO-MID-INFRARED ABSORPTIVE OPTICAL CONTROL COATINGS

(71) Applicant: United States of America as represented by the Administrator of NASA, Washington, DC (US)

(72) Inventors: Edward J. Wollack, Greenbelt, MD (US); Vivek H. Dwivedi, Greenbelt, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 65 days.

(21) Appl. No.: 18/893,624

(22) Filed: Sep. 23, 2024

(51) Int. Cl.
*G02B 1/10* (2015.01)
*C09D 5/32* (2006.01)
*C23C 16/06* (2006.01)
*C23C 16/455* (2006.01)
*G02B 5/02* (2006.01)
*G02B 5/20* (2006.01)

(52) U.S. Cl.
CPC ................. *G02B 1/10* (2013.01); *C09D 5/32* (2013.01); *C23C 16/06* (2013.01); *C23C 16/45525* (2013.01); *G02B 5/0226* (2013.01); *G02B 5/0294* (2013.01); *G02B 5/208* (2013.01)

(58) Field of Classification Search
None
See application file for complete search history.

(56) References Cited

FOREIGN PATENT DOCUMENTS

TW 201527447 A * 7/2015 ............... C09D 7/61

OTHER PUBLICATIONS

Moriya et al., TW-201527447-A, Jul. 16, 2015 (machine translation) (Year: 2015).*

* cited by examiner

*Primary Examiner* — Cheng Yuan Huang
(74) *Attorney, Agent, or Firm* — Heather Goo; Matthew F. Johnston; Trenton J. Roche

(57) ABSTRACT

The present invention relates to a far-to-mid-infrared absorptive optical coating, including: an optically opaque conductive substrate; a primer layer applied to a surface of the optically opaque conductive substrate; a conductively loaded dielectric media which coats the optically opaque conductive substrate on the primer layer; and a monolayer of a randomly deposited microspheres or microbubbles, each of the microspheres or microbubbles having an outer surface; and a monolayer of a metal film deposited on the outer surface of each of the microspheres or microbubbles by an atomic layer deposition (ALD) process to form a coated absorptive surface on the microspheres or microbubbles; wherein the monolayer of coated microspheres or microbubbles is applied to the conductively loaded dielectric media and cured to result in the far-to-mid infrared absorptive optical coating which provides wavelength-scale absorptive-scatters and in-band impedance matching at a surface of the monolayer of the coated microspheres or microbubbles.

20 Claims, 1 Drawing Sheet

ATOMIC LAYER DEPOSITION (ALD) ENHANCED FAR-TO-MID-INFRARED ABSORPTIVE OPTICAL CONTROL COATINGS

ORIGIN OF THE INVENTION

The invention described herein was at least in-part made by an employee of the United States Government and may be manufactured or used by or for the Government of the United States of America for governmental purposes without the payment of any royalties thereon or therefor.

BACKGROUND OF THE INVENTION

1. Field of the Invention

The present invention relates to a far-to-mid-infrared absorptive optical coating, and a method of manufacturing same using Atomic Layer Deposition (ALD).

2. Description of the Related Art

Atomic layer deposition (ALD) is a cost-effective nano-additive manufacturing technique that allows for the conformal coating of substrates with atomic control in a benign temperature and pressure environment. Through the introduction of paired precursor gases, thin films can be deposited on a myriad of substrates ranging from glass, polymers, aerogels, metals and high aspect ratio geometries. The physical properties of these thin films can be tailored to meet a variety of design needs for optical, thermal, and electrical coating applications.

During ALD, the deposition or growth of a film is achieved by exposing the substrate/surface to alternate gaseous species. These gaseous species are introduced to react with the surface via a series of sequential non-overlapping pulses. The surface is composed of a finite number of sites for the gaseous specie to react with. Atomically precise growth is achieved as surface reactions are terminated once all reactive sites on the surface are consumed.

Due to the sequential nature of the ALD as well as its surface limited properties, this technology has several inherent advantages including: 1) deposition occurs on both two dimensional (2D) flat structures as well as on three dimensional (3D) complex shapes, and 2) the resulting films are conformal across a large area. For example, if a material using ALD was deposited on a silicon wafer equivalent in size to the Washington D.C. metro area, the resulting film would have a conformal thickness with a 60-micron variation across the entire area. This is, by definition, atomic precision.

The specific technical application of ALD is an ideal complement for in-space assembly. An area that has been lacking in technology development is the ability to provide multi-functional coatings to spacecraft system components—most importantly, the ability to coat large area telescope mirrors in the vacuum of space.

In fact, ALD is ideal in providing a method of coating mirrors with specific materials that are tailored for the areas of the multiwavelength spectrum. As an example, nickel and carbon are materials of choice for Soft X-ray, and metal fluorides are ideal for far ultraviolet (UV) science applications.

Another area of importance is in the semiconductor market. Intrinsically the semiconductor manufacturing process occurs in an ultra-clean high-vacuum environment. This multibillion-dollar industry benefits in a microgravity in space environment. ALD is currently the central technology used in the sub-5-micron microprocessor manufacturing process while an in-orbit platform provides cleaner chips and an inherent high vacuum domain.

Absorptive optical coatings are commonly realized by using a conductively loaded dielectric media. A low-dielectric filling fraction is commonly employed to achieve low-reflectance. Examples of this approach include the use of low-density free-standing nanotubes or a foam-like structures with voids comparable in scale to the wavelength of interest. While this strategy has led to numerous "black" paints, "black" silicon structures, and nanotube coatings of practical utility in optical wavebands, this approach is problematic in moving to the infrared. This tension occurs for several reasons:

1) In directly scaling from the optical to the far-infrared—to achieve identical performance—the void features and layer thickness need to be increased by a factor of about 100 while maintaining the same density, leading to extremely fragile structures.

2) The thermal emission is a greater concern. In the optical, while operation of an imaging system at room temperature can be viable, in the far-to-mid infrared, cryogenic operation is necessitated by the needs to appropriately control the detector system sensitivity and background. The optical and electrical properties of suitable materials change upon cooling. This tends to increase required coating thickness to achieve the desired loss in the coating prior to reflection by the underlying substrate. In addition, the coating must survive the differential mechanical stresses encountered in cooling, as well as have sufficient thermal conductivity, strength, and mechanical compliance to reliably survive repeated thermal cycling.

3) While the desired properties are achievable by application in multiple layers to build up the desired thickness, this increases the cost, processing complexity, and implement risk—the resulting "black" coatings are substantially thicker than electromagnetically required, relatively fragile, and have higher internal mechanical stress than their optical counterparts. This can lead to coating adhesion failure upon cooling to the desired cryogenic service temperature. The particulate debris or contamination associated with such failures compromises the instrument performance (e.g., resulting in reduction in efficacy of the desired coating function, scattering of light from redistributed debris, providing unintended electrically conductive pathways, etc.), and is costly to mitigate and/or correct upon detection.

4) In addition, a processing issue commonly encountered with existing approaches for far-to-mid infrared applications is the total achievable thickness and control over its variability (i.e., achieved via aerosol spraying, chemical conversion, or additive growth of low density conductively loaded media) is relatively poor. This can lead to poor coating performance across the surface and can compromise the optical system response. If present, costly rework to mitigate this concern can be required.

Alternatively, conductively loaded bulk dielectric mixtures (e.g., found in use in the microwave and millimeter (e.g., about 1 to 300 GHz, which corresponds to wavelengths and length scales of interest of meters to millimeters) can be used. The material is patterned into pyramidal tapers which are relatively fragile, have relatively high areal mass density, and are challenging to manufacture at wavelengths of interest for far-to-mid infrared (i.e., 300 to a few microns). Due to the high refractive index of the dielectric binders, conductive loading media, and of additives for coefficient of thermal expansion (CTE) compensation—these materials tend to have relatively high reflectance (e.g., 0.6-to-0.8), when used in bulk form and significantly limit the palette of practical design solutions for low reflectance baffle and radiation control structures. As a result, these materials are commonly formed by molding/casting, thermal forming, or direct machining, or similar processes to reduce the total mass and reflectance of the resulting structures.

While precision absorption structures of this class can be realized through micro-machining silicon or precision patterning and coating metal structures—these relatively specialized manufacturing approaches are appropriate for sensor hybridization (i.e., areas corresponding to −10 sq centimeters), or precision calibration structures. This approach is cost prohibitive for general infrared instrumentation and passive cooling applications, which have area coverage needs which can easily exceed several square meters.

For these reasons—the above approaches do not meet the instrumentation needs for high performance far-to-mid IR imaging cameras, photometers, polarimeters, and spectrometer instrument systems. Thus, a new strategy which can correct for the above disadvantages, is needed.

SUMMARY OF THE INVENTION

The present invention relates to a far-to-mid-infrared absorptive optical coating, and a method of manufacturing same using Atomic Layer Deposition (ALD).

The present invention relates to the use of Atomic Layer Deposition (ALD) to realize robust coatings with increased strength, reduced total mass, and suitable ionizing radiation control for infrared space flight applications. Infrared instruments for space borne missions require low-reflectance absorptive-coatings, which are mechanically robust and are thermally matched to the underlying substrate material in order to survive and achieve the required performance at cryogenic temperatures. These coatings are commonly used to mitigate image artifacts arising from glint/ghosting and internal reflections within infrared instrument systems.

In addition, in image quality control, these coatings are used to control the thermal noise, define the sensitivity of the detector system, and the instrument system's background contribution. These attributes are particularly challenging to realize in the far-to-mid infrared at relevant temperatures of interest due to the required coating thickness as set by material properties and the radiation wavelength scale and are resolved by the present invention.

In one embodiment, a far-to-mid-infrared absorptive optical coating, includes: an optically opaque conductive substrate; a primer applied to a surface of the optically opaque conductive substrate to form a primer layer; a conductively loaded dielectric media which coats the optically opaque conductive substrate on the primer layer; and a monolayer of a randomly deposited plurality of microspheres or microbubbles, each of the plurality of microspheres or microbubbles having an outer surface; and a monolayer of a metal film deposited on the outer surface of each of the plurality of microspheres or microbubbles by an atomic layer deposition (ALD) process to form a coated absorptive surface on the plurality of microspheres or microbubbles; wherein the monolayer of the plurality of coated microspheres or microbubbles is applied to the conductively loaded dielectric media and cured to result in the far-to-mid infrared absorptive optical coating which provides wavelength-scale absorptive-scatters and in-band impedance matching at a surface of the monolayer of the plurality of coated microspheres or microbubbles.

In one embodiment, the optically opaque conductive substrate is a metal substrate including of one of a copper, an aluminum, or a titanium metal, or an alloy thereof.

In one embodiment, a surface of the optically opaque conductive substrate is roughened.

In one embodiment, the primer is one of an electrically dissipative or an insulating primer.

In one embodiment, the conductively loaded dielectric media is a thermal epoxy binder including a mixture of one or more epoxies, the epoxies including relatively higher glass transition temperature ($T_g$) epoxies and relatively lower viscosity optical graphite-filled epoxies.

In one embodiment, the conductively loaded dielectric media further includes: at least one restrahlen material which augments infrared blocking properties.

In one embodiment, the at least one restrahlen material includes silicon oxide.

In one embodiment, the relatively lower viscosity optical graphite-filled epoxies include graphene particles.

In one embodiment, the silicon oxide provides coefficient of thermal expansion (CTE) compensation with respect to the optically opaque conductive substrate at cryogenic temperatures.

In one embodiment, the coefficient of thermal expansion (CTE) of the thermal epoxy binder is matched to the optically opaque conductive substrate.

In one embodiment, the plurality of microspheres or microbubbles are made of borosilicate glass.

In one embodiment, the monolayer of the metal film is relatively optically thin in the far infrared and is deposited on the plurality of coated microspheres or microbubbles as a resistive coating.

In one embodiment, radiation incident on the plurality of coated microspheres or microbubbles is one of directly absorbed or coupled into the outer surface of the plurality of coated microspheres or microbubbles, or its signature is diluted by scattering to large angles.

In one embodiment, the optical coating further includes: a coating of paint of one of an optical absorptive paint which enhances an absorption band at short wavelengths or a diffusive paint which rejects optical radiation, which is coated on said far-to-mid-infrared absorptive optical coating.

In one embodiment, a method of manufacturing a far-to-mid-infrared absorptive optical coating, includes: providing an optically opaque conductive substrate; applying a primer to a surface of the optically opaque conductive substrate to form a primer layer; coating a conductively loaded dielectric media on the optically opaque conductive substrate at the primer layer; depositing a plurality of microspheres or microbubbles at random to form a monolayer of the plurality of microspheres or microbubbles; depositing a monolayer of a metal film on an outer surface of each of the plurality of microspheres or microbubbles by an atomic layer deposition (ALD) process to form a coated absorptive surface on the plurality of microspheres or microbubbles; applying the monolayer of the plurality of coated microspheres or microbubbles to the conductively loaded dielectric media; and curing the monolayer of the plurality of coated microspheres or microbubbles coated on the conductively loaded dielectric media to result in the far-to-mid infrared absorptive optical coating which provides wavelength-scale absorptive-scatters and in-band impedance matching at a surface of the monolayer of the plurality of coated microspheres or microbubbles.

In one embodiment, the method further includes: roughening a surface of the optically opaque conductive substrate before applying the primer layer; wherein the optically opaque conductive substrate is a metal substrate comprised of one of a copper, an aluminum, or a titanium metal, or an alloy thereof.

In one embodiment, the method further includes: forming the conductively loaded dielectric media by forming a thermal epoxy binder by mixing one or more epoxies, the epoxies including relatively higher glass transition temperature ($T_g$) epoxies, and relatively lower viscosity optical graphite-filled epoxies; wherein the coefficient of thermal expansion (CTE) of the thermal epoxy binder is matched to the optically opaque conductive substrate.

In one embodiment, the method further includes: coating one of an optical absorptive paint which enhances an absorption band at short wavelengths or a diffusive paint which rejects optical radiation, on the far-to-mid infrared absorptive optical coating.

In one embodiment, the conductively loaded dielectric media further includes: at least one restrahlen material which augments infrared blocking properties; and the at least one restrahlen material includes silicon oxide which provides coefficient of thermal expansion (CTE) compensation with respect to the optically opaque conductive substrate at cryogenic temperatures.

In one embodiment, the relatively lower viscosity optical graphite-filled epoxies include graphene particles; and the plurality of microspheres or microbubbles are made of borosilicate glass.

Thus, some features consistent with the present invention have been outlined in order that the detailed description thereof that follows may be better understood, and in order that the present contribution to the art may be better appreciated. There are, of course, additional features consistent with the present invention that will be described below, and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods, and systems for carrying out the several purposes of the present invention. It is important, therefore, that the claims be regarded as including such equivalent constructions insofar as they do not depart from the spirit and scope of the methods and apparatuses consistent with the present invention.

BRIEF DESCRIPTION OF THE DRAWINGS

The description of the drawings includes exemplary embodiments of the disclosure and are not to be considered as limiting in scope.

DESCRIPTION OF THE INVENTION

Figure 1A:
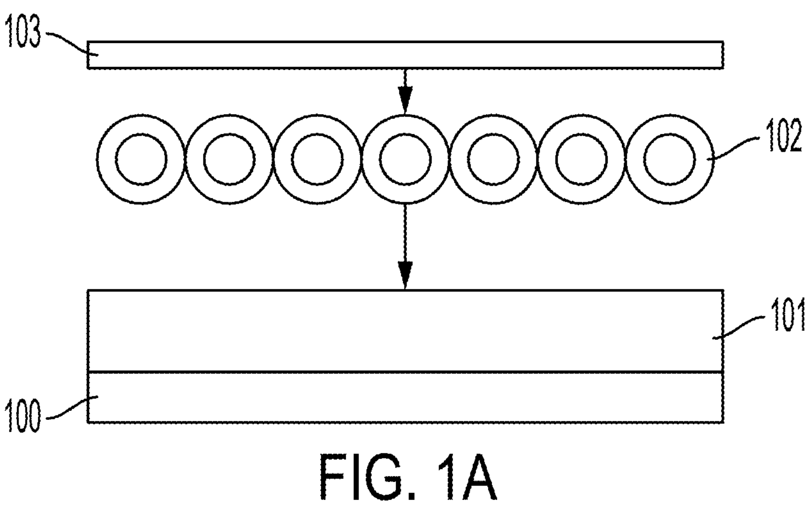
FIG. 1A shows a schematic drawing, in cross-sectional view, of a plurality of microspheres or microbubbles being coated with a thin metal film coating using ALD, the coated microspheres or microbubbles which are to be applied to a substrate with epoxy binder thereon, according to one embodiment consistent with the present invention.

The present invention relates to a far-to-mid-infrared absorptive optical coating, and a method of manufacturing same using Atomic Layer Deposition (ALD).

The present invention relates to the use of Atomic Layer Deposition (ALD) to realize robust coatings with increased strength, reduced total mass, and suitable ionizing radiation control for infrared space flight applications. Infrared instruments for space borne missions require low-reflectance absorptive-coatings, which are mechanically robust and are thermally matched to the underlying substrate material in order to survive and achieve the required performance at cryogenic temperatures. These coatings are commonly used to mitigate image artifacts arising from glint/ghosting, the Narcissus effect (e.g., the retroreflection of the cooled detector onto itself from the cold shield or Lyot stop into the optical path and is subsequently focused onto the detector), and internal other reflections within infrared instrument systems.

In one embodiment, the coating of the present invention (see FIGS. 1A-1C) is designed for use on an optically opaque (transmission, T=0), conductive substrate 100, preferably made of a metal (e.g., copper (Cu), aluminum (Al), titanium (Ti), or alloys thereof, etc.), which provides mechanical support, and which is commonly employed in an instrumentation setting. The thickness of the substrate 100 is not particularly limited, as long as it provides the mechanical strength to support the layers of the coating without damage (i.e., cracking, etc.).

In one embodiment, the interface 100A of the metal substrate 100 is typically roughened at the scale of guide wavelength of interest (i.e., the freespace wavelength, $l_o$, divided by the refractive index of the lossy dielectric media) to enhance diffusive internal scattering within the absorptive coating and provide enhanced mechanical adhesion. Depending upon the substrate employed, this can be realized by sandblasting with an appropriate media, anisotropically etching, or direct machining).

In one embodiment, an electrically dissipative "primer" or buffer layer 109 is applied to the substrate 100/100A and serves as an adhesion promotor between the substrate 100/100A and the absorptive coefficient of thermal expansion (CTE) interface stress reduction layer 101 which holds the ALD microspheres or microbubbles 104. In one embodiment, an insulating primer 109 can be substituted if charge control introduced by ionizing radiation in the environment, is not a required attribute of the surface in service.

In one embodiment, the absorptive coefficient of thermal expansion (CTE) interface stress reduction layer 101 is an epoxy binder 101, such as a thermal polymer epoxy, which is provided to coat the metal substrate 100 and buffer layer 109. In one embodiment, the epoxy binder 101 can include a mixture of one or more epoxies, and the electromagnetic properties of the epoxies can be tailored by appropriate selection and formulation of the mixture's complex dielectric function as a function of the volume filling fraction of the mixture's components.

In one embodiment, the epoxy binder 101 can be a mixture of high glass transition temperature ($T_g$) epoxies, such as fiber optic grade Epo-Tek® 377 epoxy (i.e., "377 epoxy"), or a low viscosity optical graphite-filled Epo-Tek® 377H epoxy (i.e., "377H epoxy"), or the like.

In one embodiment, a conductively loaded dielectric epoxy binder 101 is realized from a mixture of the 377 epoxy subsequently loaded with conductive graphene particles whose size, number density, and composition has been tailored to provide the desired features. This can be achieved for example, through the controlled dilution of 377H epoxy (which is too reflective of a conductively loaded mixture on its own) with 377 epoxy.

In one embodiment, the desired features to be achieved in the epoxy binder 101 include the required optical absorption, thermal conduction, CTE, mechanical strength, electrical functionality, chemical stability, conductively loaded dielectric volume filling fraction, and appliability (i.e., viscosity) by spraying, screening, or molding/casting depending upon the complexity and material properties of the object to be coated.

In one exemplary embodiment, the 377H epoxy is diluted with 377 epoxy to achieve a dielectric loading which provides a high emissivity (i.e., low bulk reflectance) in the far-infrared. Silicon oxide ($SiO_x$) was added to match the coefficient of thermal expansion (CTE) to a typical metal for typical use at cryogenic temperatures. Choice of a low index material helps keep the reflectance low and increases the emission above 600 icm due to the absorption bands in the infrared.

In this exemplary embodiment, the carbon in its solid form as graphene particles ("sC") is the conductive media providing ohmic loss, the silicon oxide provides CTE (coefficient of thermal expansion) compensation with respect to the metallic substrate 100 at cryogenic temperature, and the 377 epoxy is used to bind the mixture 101.

In one exemplary embodiment, the engineered conductively loaded dielectric media (epoxy binder) 101, was produced from a mixture with the following composition sC(0.05):377(0.65):$SiO_x$(0.30) (see Table 1 below), where the values indicate the fraction of each material by volume. In one embodiment, appropriate amounts of 377 epoxy, graphene (sC), and silica ($SiO_x$) required to enhance the formulation's radiative properties in the infrared (IR) are computed and formulated.

In one embodiment, the coefficient of thermal expansion (CTE) of the epoxy binder mixture 101 is matched to the metal substrate 100 to exhibit the following:

1) the epoxy binder 101 is a suitable primer to coat the metal substrate 100;
2) the epoxy binder layer 101 has high absorptance and modest reflectance at the longest wavelength of interest for waves penetrating into the conductive media 101; and
3) mechanically, the epoxy binder 101 serves as a mechanical buffer layer 101 to reduce the coating stress.

In one embodiment, the epoxy binder 101 has survived repeated thermal cycling from room temperature to 3° K without adhesion failure or particle generation.

In one embodiment, other formulations could be used for the above binder 101 purposes. In one embodiment, the thickness of the epoxy binder 101 layer is ~0.5 mm to provide sufficient signal attenuation prior to scattering off the roughened substrate 100/100A and provide mechanical integrity.

In one alternative embodiment, a sprayed layer 109 thinned with toluene to reduce the viscosity, is applied on the roughened-substrate 100/100A interface, and serves as a primer/buffer layer 109 to enhance adhesion and provide a reliable cryogenic bond to the metal substrate 100.

In one embodiment, a monolayer 102 of randomly deposited hollow (i.e., borosilicate) microspheres or microbubbles has an outer surface coated with a monolayer 103 of a thin metal film via ALD to form a meta-material absorptive surface 107 on the microspheres 102 (see FIG. 1A). In one embodiment, the microspheres/microbubbles 102 are made of borosilicate glass with a density of 2.23 gm/cm$^3$, and a size ranging from 15-115 μm in diameter. In one embodiment, the diameter of each microsphere/microbubble 102 is similar or less than in scale to the longest wavelength of interest. In principle, these structures could be patterned to reduce reflections.

In one embodiment, the thin metal film 103 ALD process utilizes a method with thin metal precursors 103 such as Titanium Nitride (TiN), Ruthenium (Ru), Niobium (Nb), Gallium (Ga), Hafnium (Hf) and Titanium (Ti), which are similar in ALD window (i.e., range of temperatures where ALD can occur), growth rate, and roughness. The growth per cycle for many ALD films 103 is typically less than one A/cycle, depending on the individual process to enable the desired impedance scale for the resistive film. In one embodiment, the thin metal film 103 achieved by ALD is

TABLE 1

| Composition Material | er' | er'' | Density (g/cm$^2$) | Mass (gm) | Mass Fraction | Volume Fraction |
|---|---|---|---|---|---|---|
| Graphite | 2.80 | >>1 | 2.0 | 0.065 | 0.065 | 0.05 |
| $SiO_x$ | 3.82 | 0.061 | 2.20 | 0.428 | 0.428 | 0.30 |
| Epo-Tek ® 377 | 3.36 | 0.01 | 1.20 | 0.507 | 0.507 | 0.65 |
| sC(0.05):377(0.65):$SiO_x$(0.30) | 5.20 | 0.18 | 1.54 | 1.000 | 1.000 | 1.00 |

In one embodiment, additional "reststrahlen" materials (i.e., beyond the SiOx—which is a reststrahlen material, as indicated above) can be used to tailor and augment the materials' IR blocking properties independent of the out-of-band wave response.

optically thin in the far infrared (IR) and approximates a resistive coating 107 on the microspheres 102.

In one embodiment, the ALD coating procedure is commensurate with the methods disclosed in U.S. Pat. No. 10,781,517 B1, issued Sep. 22, 2020, to one of the present inventors, and which is herein incorporated by reference in its entirety. Generally, in one embodiment, the uncoated microspheres/microbubbles are loaded into a meshed basket of a specific volume not to exceed 50% of the basket volume. In one embodiment, the loaded basket is attached to an axle that is connected to a motor. In one embodiment, the basket is placed inside a vacuum chamber through a feed-through and rotated at a specific RPM. In one embodiment, an isolation valve is placed downstream at the vacuum port to allow all precursor gases a residence time for reaction. In one embodiment, precursor gas (1) is injected into the vacuum chamber. In one embodiment, the basket rotation allows the microspheres to have its surface area exposed to the precursor gas (1). In one embodiment, after the completion of the gas surface reaction, based on the residence time of the gas (1), the gas (1) is evacuated from the chamber. In one embodiment, a purge gas is then introduced to remove excess gas (1). In one embodiment, the process is repeated for gas (2). In one embodiment, the number of pulses of gases (1) and (2) determine the thickness of the coated film.

In one exemplary embodiment, titanium nitride ($TiN_x$) ALD was used on the microspheres/microbubbles 102 which employs an anhydrous hydrazine ($N_2H_4$) and titanium tetrachloride ($TiCl_4$). In one embodiment, the $N_2H_4$ serves as reducing agent and has been observed to lead to lower incorporation of oxygen, carbon, and chlorine impurity concentration in the resulting films, and produces lower ALD film resistivity approximating stoichiometric TiN.

In the exemplary embodiment, the thin film 107 deposited was ~8 nm inferred from the number of ALD cycles and nominal growth rate. In one embodiment, this thickness is consistent with that inferred from room temperature (300° K) and cryogenic (5° K) FTS (Fourier transform spectrometer) transmission measurements in a focused beam of an optical witness sample deposited on an 80-micron thick silicon substrate 100.

In the exemplary embodiment, the surface resistivity over the spectral range 100-to-500 icm (i.e., radiation wavelengths of 100-to-20 μm) is constant, Rsq~200 ohm/sq, and the residual resistance ratio was ~1.1 in cooling the sample from room temperature to 3K. In one embodiment, the conductive thin film resistive coating 107 applied by ALD to the microspheres/microbubbles 102 is ~100-to-300 ohm/sq. In one embodiment, this absorptive scattering media is filtered with a mesh to diameters<100 μm to further control the uniformity of the size distribution of the absorptive microspheres/microbubbles 102 incorporated in the coating.

In one embodiment, for a film with a physical thickness, t, is small compared to the field penetration scale or skin depth (δ), $R_{sq}$ is the primary physical observable which controls the response, and the coating parameters were essentially tuned to provide this value prior to performing the coating deposition.

In one embodiment, wavelengths small compared to the size of the microspheres/microbubbles 102, provide specular reflection signature reduction through absorption, impedance matching, and diffuse scattering—at wavelengths comparable to and larger than their size, they approximate a relatively low dielectric function media.

In one embodiment, with a volume filling fraction of 0.053 and complex dielectric permittivity $\varepsilon_r$*(1 icm) =1.114+0.0024i, is observed in agreement with the Maxwell-Garnett effective media estimate computed from mixture's components and bulk properties.

In one embodiment, for sub-Kelvin applications, a non-metallic metal is desired as a coating material for the microspheres/microbubbles 102 to minimize the coating heat capacity and cooling time scale in use.

In one embodiment, the monolayer of coated hollow silica microspheres/microbubbles 102/107 is applied to the epoxy binder 101 and then cured to result in layer 104, forming a robust mechanical structure 105 (i.e., layer 104, epoxy binder 101, primer 109, and substrate 100) which is dissipative and can be connected to the vehicle chassis or ground (i.e., "grounded") to prevent deep dielectric charging by ionizing radiation and discharge, for spaceborne applications. In one embodiment, the layer 104 provides wavelength-scale absorptive-scatterers and in band impedance matching at the surface of the coating 107.

Figure 1B:
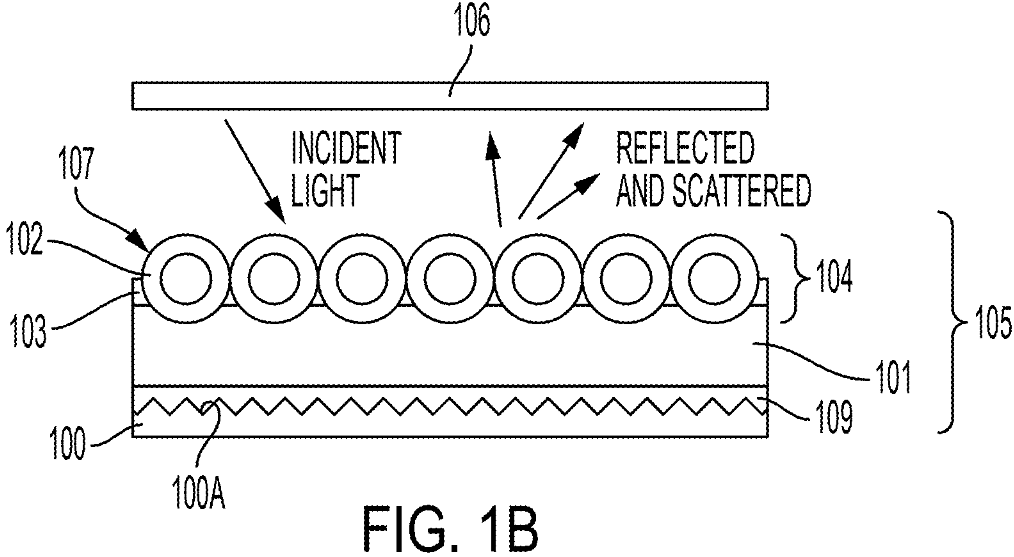
FIG. 1B shows a schematic drawing, in cross-sectional view, of layers of the coated microspheres or microbubbles, fixed to the epoxy binder on the substrate, with an optional black absorptive paint being applied to the layers, according to one embodiment consistent with the present invention.

In one embodiment, radiation R incident on the silica microspheres/microbubbles 102/107 of the layer 104 can be directly absorbed, coupled into the silica wall of the sphere 102/107 (i.e., where it bounces multiple times and is absorbed by the resistive film 107), or its signature is diluted by scattering to large angles (see FIG. 1B).

Figure 1C:
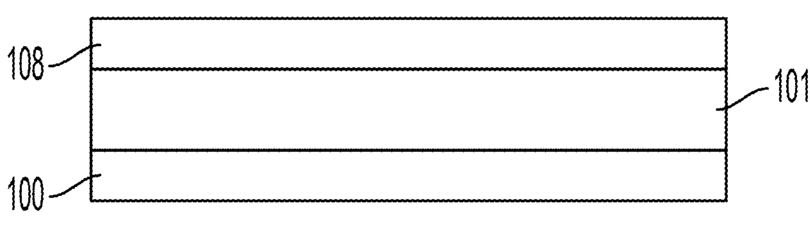
FIG. 1C shows a schematic drawing, in cross-sectional view, of the final layers of the far-to-mid-infrared absorptive optical coating, including a "black" coating ("black" paint and coated microspheres or microbubbles), epoxy binder, and substrate, according to one embodiment consistent with the present invention.

In one embodiment, once the layer 104 is cured, if desired, the far-to-mid-IR absorber structure/optical coating 105 can be coated with a ~20-to-50 μm optional traditional optical "black" absorptive paint 106 to enhance the absorption band at short wavelengths or a "white" diffusive paint 106 to reject optical radiation (see FIG. 1C). At this thickness and broad tolerance, the longwave response of the coating 107 is preserved.

In one embodiment, the optional optical black (or optically rejecting white) paint 106 may be applied to the surface to tailor the coatings' properties above the infrared band of interest. In one embodiment, the layer 106 has a low index with a thickness small compared to the far-infrared wavelengths of interest.

In one embodiment, the layered "black" coating absorption structure 108 (see FIG. 1C) of the present invention has the following novel features:

1) enhanced far-to-mid infrared absorption relative to existing coatings;
2) the primer/buffer/epoxy layer 105 enables survival of cryogenic cycling without debris generation;
3) the components of the coating structure 108 are dissipative and can be grounded to enable control over deep dielectric charging by ionizing radiation, particularly in space flight applications;
4) the heat capacity is compatible with cryogenic needs; and
5) this approach allows the flexibility to absorb or reject optical radiation for passive cooling applications, if desired. This consideration is of particular importance in minimizing the radiator area for structures cooling to low temperatures.

The resulting far-to-mid infrared absorptive optical coatings 105/108 of the present invention can be used in infrared/THz imaging and spectroscopy applications and are a novel improvement over existing paints which are largely used in the optical which suffer from the limitations described in the above Background of the Invention. Tailoring the electromagnetic properties of the coating layers and geometry enables realization of a broad band absorption response where the mass required per unit area has been minimized. This consideration is important for space flight applications in the far-to-mid-IR where the instrument size and mass present challenges.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A far-to-mid-infrared absorptive optical coating, the coating comprising:

an optically opaque conductive substrate;

a primer applied to a surface of the optically opaque conductive substrate to form a primer layer;

a conductively loaded dielectric media which coats the optically opaque conductive substrate on the primer layer; and a monolayer of a randomly deposited plurality of microspheres or microbubbles, each of the plurality of microspheres or microbubbles having an outer surface; and a monolayer of a metal film deposited on the outer surface of each of the plurality of microspheres or microbubbles by an atomic layer deposition (ALD) process to form a coated absorptive surface on the plurality of microspheres or microbubbles;

wherein the monolayer of the plurality of coated microspheres or microbubbles is applied to the conductively loaded dielectric media and cured to result in the far-to-mid infrared absorptive optical coating which provides wavelength-scale absorptive-scatters and in-band impedance matching at a surface of the monolayer of the plurality of coated microspheres or microbubbles.

2. The optical coating of claim 1, wherein the optically opaque conductive substrate is a metal substrate comprising of one of a copper, an aluminum, or a titanium metal, or an alloy thereof.

3. The optical coating of claim 2, wherein a surface of the optically opaque conductive substrate is roughened.

4. The optical coating of claim 1, wherein the primer is one of an electrically dissipative or an insulating primer.

5. The optical coating of claim 1, wherein the conductively loaded dielectric media is a thermal epoxy binder comprising a mixture of one or more epoxies, the epoxies including relatively higher glass transition temperature ($T_g$) epoxies and relatively lower viscosity optical graphite-filled epoxies.

6. The optical coating of claim 5, wherein the conductively loaded dielectric media further comprises:

at least one restrahlen material which augments infrared blocking properties.

7. The optical coating of claim 6, wherein the at least one restrahlen material includes silicon oxide.

8. The optical coating according to claim 5, wherein the relatively lower viscosity optical graphite-filled epoxies include graphene particles.

9. The optical coating according to claim 8, wherein the silicon oxide provides coefficient of thermal expansion (CTE) compensation with respect to the optically opaque conductive substrate at cryogenic temperatures.

10. The optical coating according to claim 9, wherein the coefficient of thermal expansion (CTE) of the thermal epoxy binder is matched to the optically opaque conductive substrate.

11. The optical coating according to claim 1, wherein the plurality of microspheres or microbubbles are made of borosilicate glass.

12. The optical coating according to claim 11, wherein the monolayer of the metal film is relatively optically thin in the far infrared and is deposited on the plurality of coated microspheres or microbubbles as a resistive coating.

13. The optical coating according to claim 12, wherein radiation incident on the plurality of coated microspheres or microbubbles is one of directly absorbed or coupled into the outer surface of the plurality of coated microspheres or microbubbles, or its signature is diluted by scattering to large angles.

14. The optical coating according to claim 1, the coating further comprising:

a coating of paint of one of an optical absorptive paint which enhances an absorption band at short wavelengths or a diffusive paint which rejects optical radiation, which is coated on said far-to-mid-infrared absorptive optical coating.

15. A method of manufacturing a far-to-mid-infrared absorptive optical coating, the method comprising:

providing an optically opaque conductive substrate;

applying a primer to a surface of the optically opaque conductive substrate to form a primer layer;

coating a conductively loaded dielectric media on the optically opaque conductive substrate at the primer layer;

depositing a plurality of microspheres or microbubbles at random to form a monolayer of the plurality of microspheres or microbubbles;

depositing a monolayer of a metal film on an outer surface of each of the plurality of microspheres or microbubbles by an atomic layer deposition (ALD) process to form a coated absorptive surface on the plurality of microspheres or microbubbles;

applying the monolayer of the plurality of coated microspheres or microbubbles to the conductively loaded dielectric media; and curing the monolayer of the plurality of coated microspheres or microbubbles coated on the conductively loaded dielectric media to result in the far-to-mid infrared absorptive optical coating which provides wavelength-scale absorptive-scatters and in-band impedance matching at a surface of the monolayer of the plurality of coated microspheres or microbubbles.

16. The method of claim 15, the method further comprising:

roughening a surface of the optically opaque conductive substrate before applying the primer layer;

wherein the optically opaque conductive substrate is a metal substrate comprised of one of a copper, an aluminum, or a titanium metal, or an alloy thereof.

17. The method of claim 16, the method further comprising:

forming the conductively loaded dielectric media by forming a thermal epoxy binder by mixing one or more epoxies, the epoxies including relatively higher glass transition temperature ($T_g$) epoxies, and relatively lower viscosity optical graphite-filled epoxies;

wherein the coefficient of thermal expansion (CTE) of the thermal epoxy binder is matched to the optically opaque conductive substrate.

18. The method of claim 17, the method further comprising:

coating one of an optical absorptive paint which enhances an absorption band at short wavelengths or a diffusive paint which rejects optical radiation, on the far-to-mid infrared absorptive optical coating.

19. The method of claim 15, wherein the conductively loaded dielectric media further comprises:

at least one restrahlen material which augments infrared blocking properties; and wherein the at least one restrahlen material includes silicon oxide which provides coefficient of thermal expansion (CTE) compensation with respect to the optically opaque conductive substrate at cryogenic temperatures.

20. The method of claim 17, wherein the relatively lower viscosity optical graphite-filled epoxies include graphene particles; and wherein the plurality of microspheres or microbubbles are made of borosilicate glass.

* * * * *